United States Patent [19]

Hicks

[11] 4,261,037

[45] Apr. 7, 1981

[54] SYSTEM FOR MONITORING UTILITY USAGE

[75] Inventor: John R. Hicks, Irving, Tex.

[73] Assignee: Dupont Energy Management Corporation, Dallas, Tex.

[21] Appl. No.: 26,804

[22] Filed: Apr. 3, 1979

Related U.S. Application Data

[63] Continuation-in-part of Ser. No. 861,899, Dec. 19, 1977, Pat. No. 4,147,978.

[51] Int. Cl.³ ....................... G06F 15/20; G01R 19/04

[52] U.S. Cl. ............................... 364/464; 235/92 EL; 324/103 R; 324/140 R; 324/142; 340/657; 364/483

[58] Field of Search ............... 364/464, 481, 483, 493, 364/418, 557; 324/103 R, 113, 116, 140 R, 142; 307/31, 18; 235/92 MT, 92 EL, 92 TF; 340/152 R, 501, 657, 660, 664, 635, 637

[56] References Cited

U.S. PATENT DOCUMENTS

| | | | |
|---|---|---|---|
| 3,778,637 | 12/1973 | Arita | 364/464 |
| 3,998,093 | 12/1976 | Bertolasi | 364/483 |
| 4,080,568 | 3/1978 | Funk | 364/483 |
| 4,106,095 | 8/1978 | Yarbrough | 364/464 |
| 4,120,031 | 10/1978 | Kincheloe et al. | 364/464 |
| 4,162,530 | 7/1979 | Kusui et al. | 235/92 EL |

*Primary Examiner*—Errol A. Krass
*Attorney, Agent, or Firm*—Hubbard, Thurman, Turner, Tucker & Glaser

[57] ABSTRACT

Electronic circuitry monitors the electrical energy consumption of a system and displays the current cost of the energy usage. The projected monthly billing cost is calculated at the current rate of consumption, and an alarm signal is generated if the projected cost is higher than a budget amount. The current flow is sensed and digital pulses are fed to a microprocessor for counting and conversion to cost parameters. Clock pulses are also directed to the microprocessor for calculating the billing period and for displaying time parameters. A keyboard enables initializing and modifying the cost and time parameters in the microprocessor.

32 Claims, 7 Drawing Figures

FIG. I

SYSTEM FOR MONITORING UTILITY USAGE

CROSS REFERENCE TO RELATED APPLICATION

This application is a continuation-in-part application of my copending application entitled "System for Monitoring Electrical Energy Consumption" filed Dec. 19, 1977 as Ser. No. 861,899 and issued on Apr. 3, 1979 as U.S. Pat. No. 4,147,978.

BACKGROUND OF THE INVENTION

This invention is concerned with a utility monitoring circuitry and more particularly with electronic circuitry for measuring the amount of energy consumed by a system, displaying the cost of the energy and controlling and monitoring the cost against a predetermined standard.

In the last few years, dramatic increases in the price of natural gas and oil have resulted in sharp rises in the cost of electricity for consumer use. Various incentives and programs have been pursued by state and federal governments and other institutions for the purpose of eliminating the waste of energy and developing more efficient energy sources. The consuming public, especially homeowners and industrial users of electrical energy, have become increasingly conscious of the need for energy conservation.

In spite of the foregoing developments, it has been difficult if not impossible for a consumer of electrical energy to readily and continually monitor the amount of energy he is using. The cost of consumed energy is normally not made available to the user until a monthly statement is received, some time after the electrical energy has been consumed and the charges have been incurred. This delay can be especially damaging during periods of high power consumption or in situations where power consuming appliances or apparatus are inadvertently left running for long periods of time.

It is possible for a consumer to manually monitor his electrical energy consumption through periodic readings of his electric meter and to then calculate the charges, but this procedure is difficult and cumbersome and is therefore not practical. Moreover, present systems do not provide for feedback control to reduce, moderate or shut down the electrical power input when the maximum desired energy usage has been reached.

BRIEF SUMMARY OF THE INVENTION

In one embodiment of the present invention, a system is provided for generating and displaying to the consumer the cost of a utility such as electrical energy being used, and for controlling the amount of the utility consumed over a given period of time. The system includes a sensor circuit for determining the rate of utility flow being consumed and for generating a digital pulse stream representative of the rate of utility usage. A counter circuit accumulates the pulse stream and provides a display signal representative of the current energy usage. A clock generator circuit provides a digital pulse stream representative of real time which is accumulated by a time counter circuit and also displayed by the display unit. A calculator circuit responsive to the energy usage count and the time count generates a projected sum representative of the expected utility usage over a predetermined period of time based on the current usage. A comparator circuit generates a control signal in response to the projected amount being greater than a predetermined amount. This control signal is used to provide an alarm to the user or to modify the rate of utility usage.

In a more specific embodiment of the present invention, electronic circuitry is provided for monitoring the amount of electrical energy consumed by a system over a plurality of input buses during a given period of time. Current flow is sensed along each input bus and a DC signal is generated having an amplitude representative of the magnitude of current flow. The DC signals are summed and a combined digital pulse signal is generated having a frequency representative of the energy consumption. A microprocessor is utilized to process the digital signals including accumulating and counting the number of pulse digital signals over a given period of time. A display unit is provided to display the pulse count in numerical form during the time period.

In yet another embodiment, the microprocessor mentioned above is utilized to count the rate of energy usage, convert the energy usage to a corresponding dollar cost, calculate the expected energy cost over a predetermined period of time, compare the projected cost to a maximum desired cost and generate a control signal if the projected cost is higher than desired.

The above invention has a number of advantages for the energy consumer. The monitoring system provides up to date information to the consumer regarding his energy usage. Data concerning cumulative energy costs are generated and continually displayed. Projected costs over a given billing period are provided to the user at any time during the billing period so that the amount of energy consumption can be modified immediately to correspond with a desired budget amount. Feedback control means can be used to automatically modify the energy consumption during the billing period. The monitoring system is generalized to monitor and control any utility usage such as electricity, gas or water by only making minor adjustments to the sensor circuitry.

BRIEF DESCRIPTION OF THE DRAWINGS

A more complete understanding of the invention may be had by referring to the following detailed description when taken in conjunction with the drawing wherein.

DETAILED DESCRIPTION OF THE DRAWINGS

Figure 1:
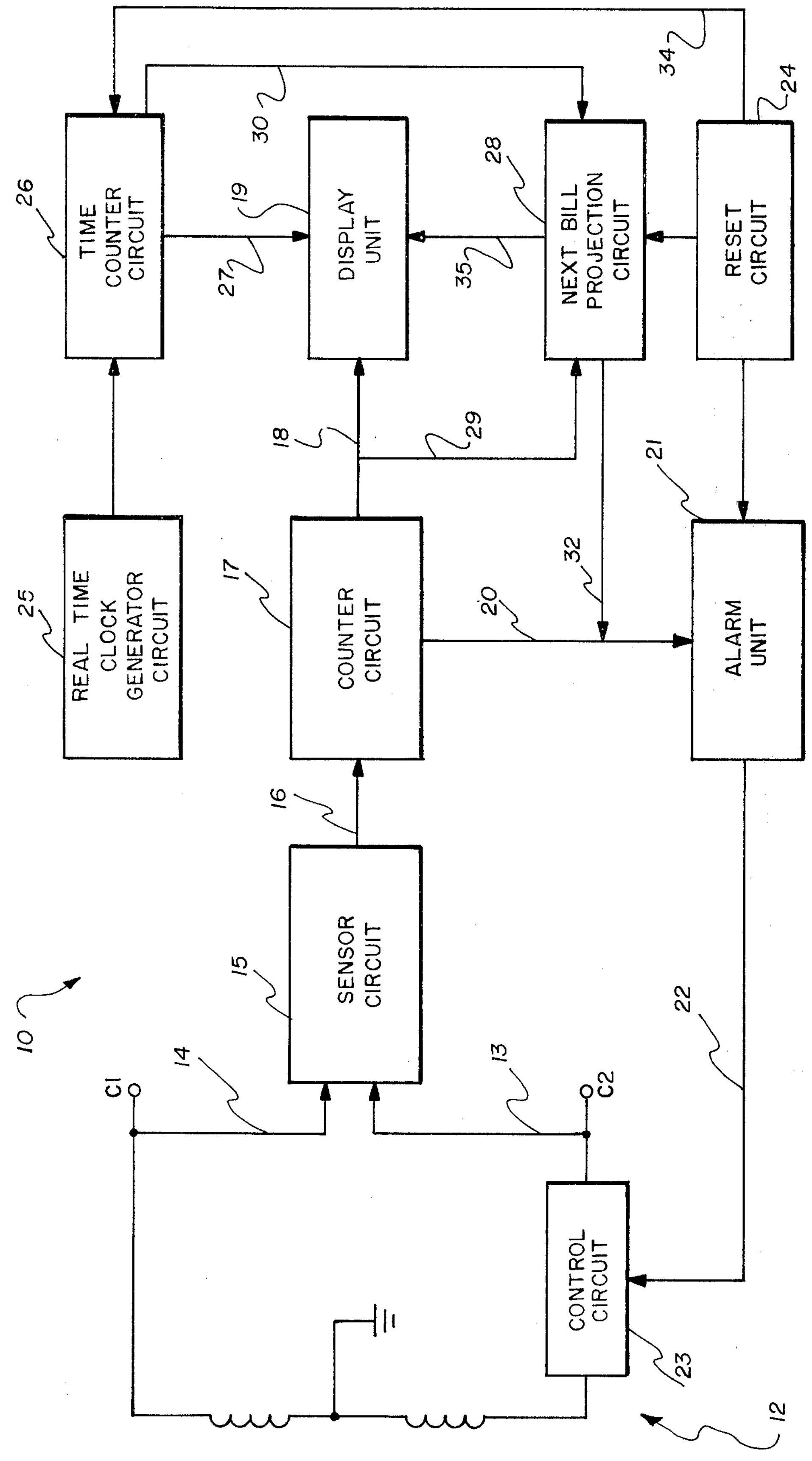
FIG. 1 is a blocked diagram of the electrical energy monitoring system embodying the present invention.

Referring now to FIG. 1, a block diagram of the electrical energy monitoring system 10 of the present invention is shown. Preferably, system 10 is connected to both legs on the secondary side of an input power transformer 12. Input terminals C1 and C2 connect to lines 13 and 14 to feed into a sensor circuit 15 which detects the magnitude of current flowing through transformer 12. Sensor circuit 15 generates a digital pulse train on line 16 having a frequency corresponding to the amplitude of the input current. Counter circuit 17 counts the incoming pulses on line 16 over a given period of time and generates signals indicative of the cost of the electrical power being used. These signals are continually fed on line 18 to a display unit 19 which decodes the signals and displays them in a dollar and cents format.

The pulses are also directed on line 20 to counters within alarm unit 21. If the counted pulse signals exceed a desired amount within a predetermined period of time, an alarm signal is generated by the alarm counters to warn the user of the excessive cost being incurred. At the same time, a control signal is directed by a line 22 to a control circuit 23 in the secondary of the input transformer 12 which can shut down or modify incoming power to the system. Circuit 23 may be any type of conventional control circuit, including a simple switch unit. At the end of the desired period of time, a reset circuit 24 zeros the counters of alarm unit 21 to begin a new period. The counters of counter circuit 17 may be reset at the same time.

A real-time clock generator circuit 25 provides a clock pulse on to a time counter circuit 26, which maintains a calendar and the time of day. This time information is periodically displayed by way of line 27 on display unit 19.

A next bill projection circuit 28 receives the accumulated cost data from counter circuit 17 on line 29 and the accumulated time and calendar data from circuit 26 on line 30. This data is processed to calculate the expected power bill to be received at the end of a billing period. This projected billing amount is compared to a stored figure representing the maximum budget amount desired by the consumer. In the event that the projected billing amount exceeds the budget amount, an alarm signal is output on line 32 to alarm unit 21, initiating alarm and feedback control operations. The bill projection amount may also be displayed at the discretion of the user by display unit 19 by way of line 35. Circuit 28 also includes storage space for storing one or more of the last months' bills to be recalled and displayed by the user.

Figure 2:
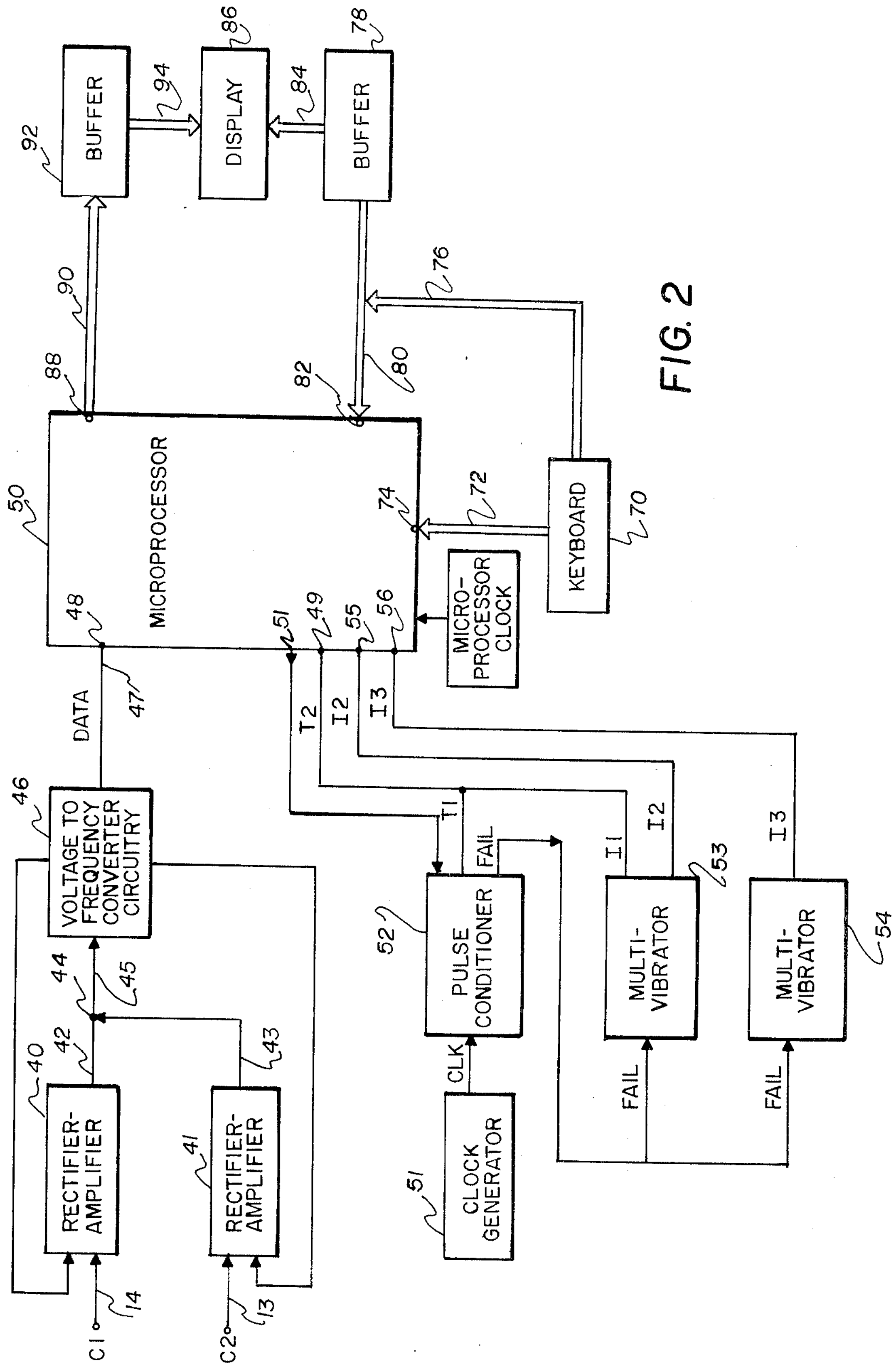
FIG. 2 is a more detailed blocked diagram of the invention shown in FIG. 1 utilizing a microprocessor.

Referring now to FIG. 2, one preferred embodiment of system 10 of the present invention is shown which utilizes a conventional microprocessor unit to perform several of the functions of the circuitry diagramed in FIG. 1. In this embodiment, counter circuits 17 and 26, next bill projection circuit 28, reset circuit 24 and alarm unit 21 are all replaced by the microprocessor 50 of the FIG. 2 system. Inputs C1 and C2 provide sensing currents generated in response to current flow in two phases of an electrical system being monitored. As shown in U.S. Pat. No. 4,147,978 the current inputs at C1 and C2 may be induced by electromagnetic sensors clamped around transformer legs in the input of a two-phase or three-phase system. It is understood that any number of phases of a multiple phase system could be sensed in the same manner.

The sensing currents are delivered along input lines 13 and 14 to rectifier-amplifier units 40 and 41 respectively, which rectify and amplify the sensed currents to provide DC signals at output lines 42 and 43. The signals are combined at node 44, and the combined DC signal is input on line 45 to voltage-to-frequency converter circuitry 46.

Converter 46 senses the amplitude of the DC signal and generates a series of digital pulses defined as the DATA signal having a frequency corresponding to the amplitude of the DC signal. The DATA signal is directed by output line 47 to the main data input terminal 48 of a microprocessor 50, which will be described in greater detail later.

The clock inputs to the microprocessor 50 are initiated by the clock generator 25 which comprises a clock generator 51, a pulse conditioner 52 and first and second multivibrators 53 and 54. Clock generator 51 provides a standard fullwave rectified 120 cycle per second output signal CLK. This signal is fed to pulse conditioner 52 which provides a digitally pulsed signal T1 to the interrupt input terminal 49 of microprocessor 50. Pulse conditioner 52 also receives a clock input signal from clock output terminal 51 of microprocessor 50.

In order to control the microprocessor in the event of a power failure, a FAIL signal output is directed from pulse conditioner 52 to the inputs of multivibrators 53 and 54. Multivibrator 53 provides a first output interrupt signal I1 which combines with T1 to provide a T2 time signal input at interrupt terminal 49 of microprocessor 50. A second output signal I2 from multivibrator 53 is communicated to a power-down reset input terminal 55 of microprocessor 50. Signal I2 alerts microprocessor 50 of imminent power failure so that further processing can be terminated. Multivibrator 54 provides a single output signal I3 along line 66 to a power-up reset input terminal 56 of microprocessor 50. Signal I3 initializes the microprocessor parameters preparatory to powering of the system by a back-up battery.

The control input to microprocessor 50 is provided mainly by keyboard matrix unit 70. Manual control data is provided directly along multiple line input bus 72 to input terminals 74 of microprocessor 50. Additional keyboard control and data input is fed along bus 76 and is multiplexed along bus 80 to multiple input terminals 82 of microprocessor 50. Selected data is also fed for display along bus 84 to a display unit 86. Processed data from microprocessor 50 is output from output terminals 88 along bus 90 to a buffer 92 for selective display by display unit 86 by way of bus 94.

The microprocessor unit 50 of FIG. 2 is preferably a No. 8048 unit manufactured by Intel Company of Santa Clara, California. This microprocessor unit is especially satisfactory for this application because it has both a programmed read-only memory with the required control functions therein and also a random access memory facilitating data storage and retrieval.

Display unit 86 is preferably a BCD-to-seven segment unit, model TIL 833 made by Texas Instruments, Dallas, Texas. Buffer 78 is preferably a power buffer multiplexer comprising a parallel bank of conventional inverter units. Similarly, buffer 92 includes a parallel bank of inverter units each being in series with a conventional buffer driver circuit providing high power output to drive the anodes of the display.

Figure 3:
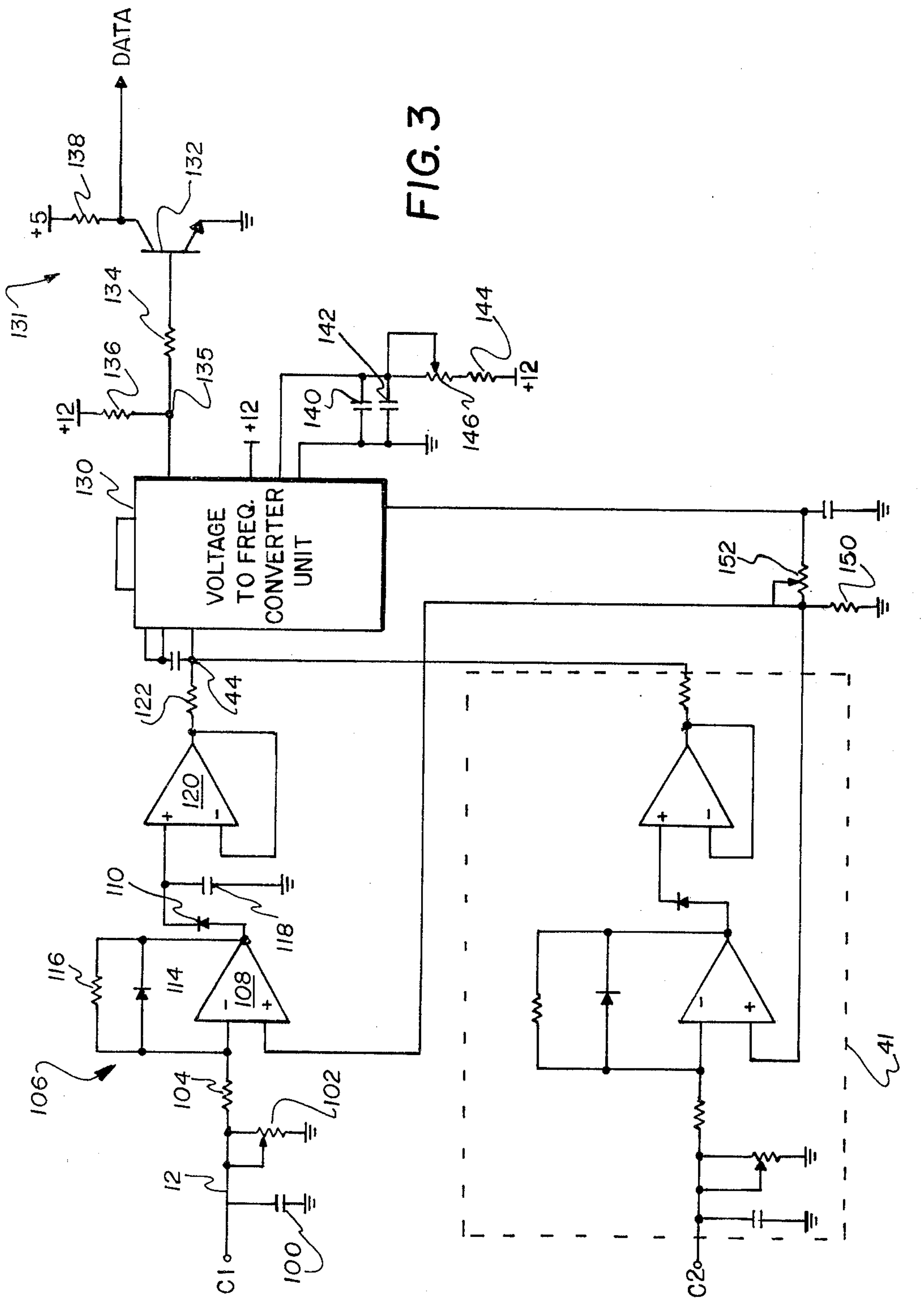
FIG. 3 is a circuit diagram of the sensing and data pulse generating units of FIG. 2.

Referring now to FIG. 3, the circuitry of rectifier-amplifier units 40 and 41 and voltage-to-frequency converter circuitry 46 are shown in greater detail. Input line 14 of rectifier-amplifier unit 40 includes a high frequency bypass isolating capacitor 100 connected to ground and a sensor damper variable resistor 102 also connected to ground. Input line 14 leads to a precision rectifier circuit 106 which enables extremely accurate sensing of induced currents as low as about 1.0 amperes. Amplifier circuitry 106 comprises input resistor 104 leading to the negative input of operational amplifier 108. The output of amplifier 108 is fed through a diode rectifier 110 to an output node 112 providing a full-wave rectified signal to the rest of the circuitry of unit 40. A second diode rectifier 114 and a resistor 116 are connected in parallel between the negative input and the output of operational amplifier 108. Node 112 is connected across a filter capacitor 118 to the positive input of a second operational amplifier 120 which acts as a buffer for the DC signal. The output of amplifier 120 is fed back into its negative input to provide high impedance to low output impedance buffering. Amplifier 120 output is also directed through a resistor 122 to an input terminal of voltage-to-frequency converter 130.

Rectifier-amplifier unit 41 preferably has identical circuitry and provides an output to be summed with the output of unit 40 at node 44. The output of voltage-to-frequency converter unit 130 is directed through a pulse conditioner circuit 131 to provide the DATA signal to the main data input terminal 48 of microprocessor 50. The pulse conditioner circuitry 131 comprises a transistor 132 having a gate input from voltage-to-frequency converter 130 through resistor 134. The gate input is biased by a plus twelve voltage fed through a bias resistor 136. The gate output is biased by a plus five voltage through a bias resistor 138 and leads directly to the data terminal input 48 of microprocessor 50.

Timing capacitors 140 and 142 are provided in connection with voltage-to-frequency converter unit 130 to determine the frequency of the output pulse provided by unit 130. Capacitors 140 and 142 are biased by a plus twelve volt supply fed through fixed resistor 144 connected in series to variable resistor 146. An offset adjust circuit includes a voltage divider made up of a fixed resistor 150 and a variable resistor 152. The intermediate node of the voltage divider is connected to the positive input of amplifier 108 to enable offset zero adjustment of the amplifier input when no current flows in the sensors.

As an alternative to the circuitry of FIG. 3, the input sensing pulses may be provided directly by a conventional power meter having a pulse initiating circuit, made for example by General Electric or Westinghouse. The output of said pulse initiating circuit may be connected directly to node 135 and would require only the pulse conditioning of circuit 131 before being directed to the microprocessor 50. Using this approach all the rest of the circuitry shown in FIG. 2 may be eliminated.

Figure 4:
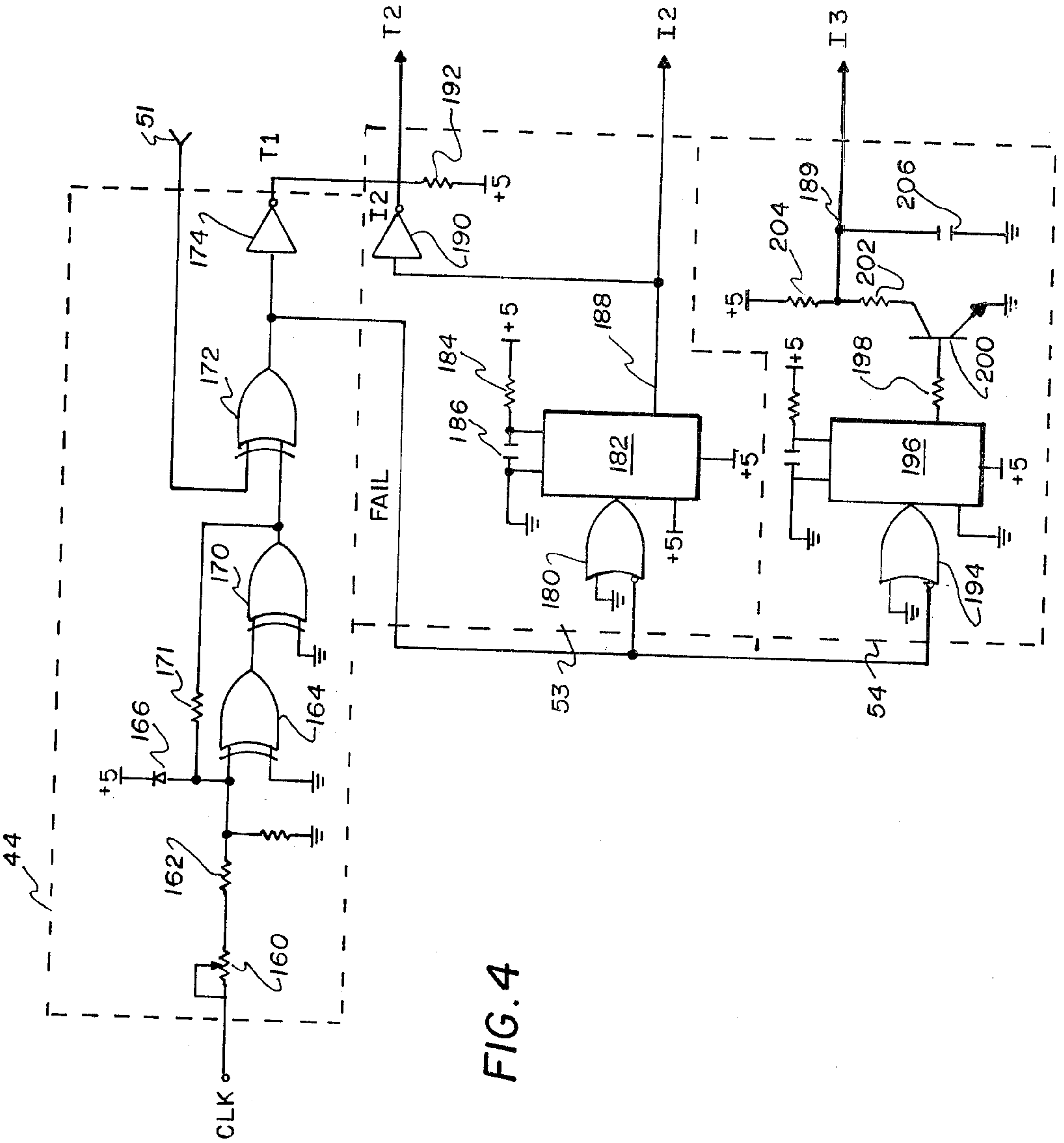
FIG. 4 is a circuit diagram of the time pulse and interrupt pulse generating circuitry of the system shown in FIG. 2.

Referring now to FIG. 4, the circuitry of pulse conditioner 52, multivibrator 53 and multivibrator 54 are shown in greater detail. The real time clock input CLK is fed through a variable resistor 160 and a fixed resistor 162 to one input of exclusive OR gate 164. The input of gate 164 is also connected through a diode 166 to a plus five voltage supply. The other input of gate 164 is connected to ground. The output of gate 164 feeds to one input of another exclusive OR gate 170 having a second input connected to ground. The output of gate 170 feeds to one input of another exclusive OR gate 172, the other input being provided by the clock output terminal 51 of microprocesor 50. The output of gate 170 also feeds back through a resistor 171 to the ungrounded input of gate 164.

The output of gate 172 feeds through an inverter 174 to the interrupt input terminal 49 of microprocessor 50. The output of gate 172 also provides the FAIL signal to multivibrator units 53 and 54 to indicate a power failure.

Multivibrator unit 53 is comprised of an OR gate 180 having the FAIL signal as one input and the other input grounded. The output of OR gate 180 feeds to a flip-flop circuit 182 powered by a plus five voltage supply. The timing terminals of flip-flop 182 are connected to the plus five voltage supply through a resistor 184 and a capacitor 186. The output signal I2 of flip-flop 182 is directed along output line 188 to power-down reset input terminal 55 of microprocessor 50. Signal I2 is also directed to an inverter 190 having an output bias by a plus five voltage supply through a resistor 192. The output signal I1 of inverter 190 is connected to the interrupt input terminal 49 of the microprocessor 50.

Multivibrator 54 is comprised of an OR gate 194 with the FAIL signal as one input and the other input grounded. The output of gate 194 leads to the input of a flip-flop unit 196 powered and timed in the same manner as flip-flop unit 182. The output of unit 196 is directed to the gate of a transistor 200 through a resistor 198. The collector of transistor 200 is connected through a resistor 202 to an output line 189 which is biased by a plus five voltage supply through a resistor 204. Output line 189 is isolated by a capacitor 206 and provides the I3 signal to the power-up reset input terminal 56 of microprocessor 50.

Figure 5:
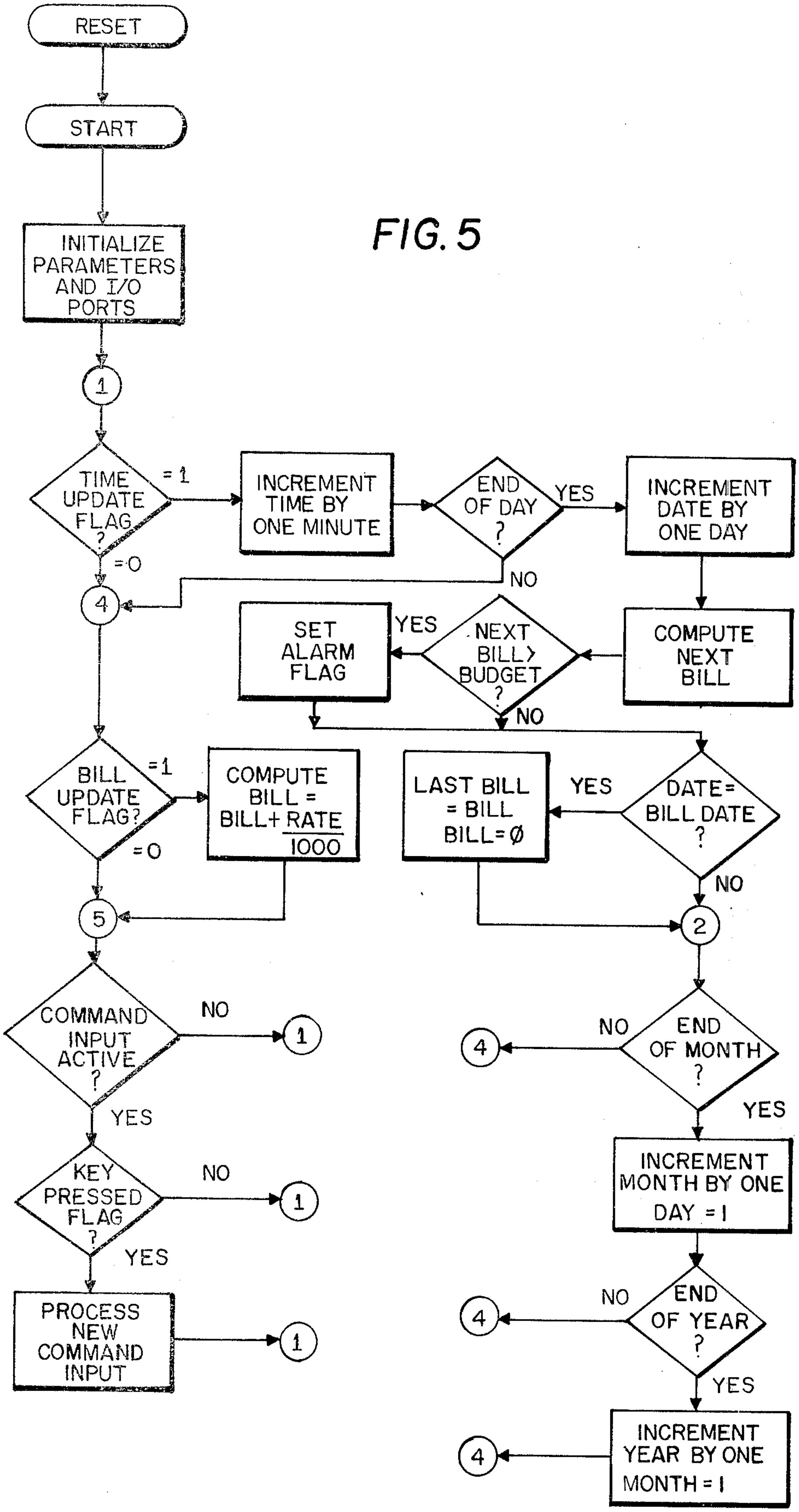
FIGS. 5, 6 and 7 are flow chart diagrams describing the operation of the system shown in FIG. 2.
Figures 6, 7:
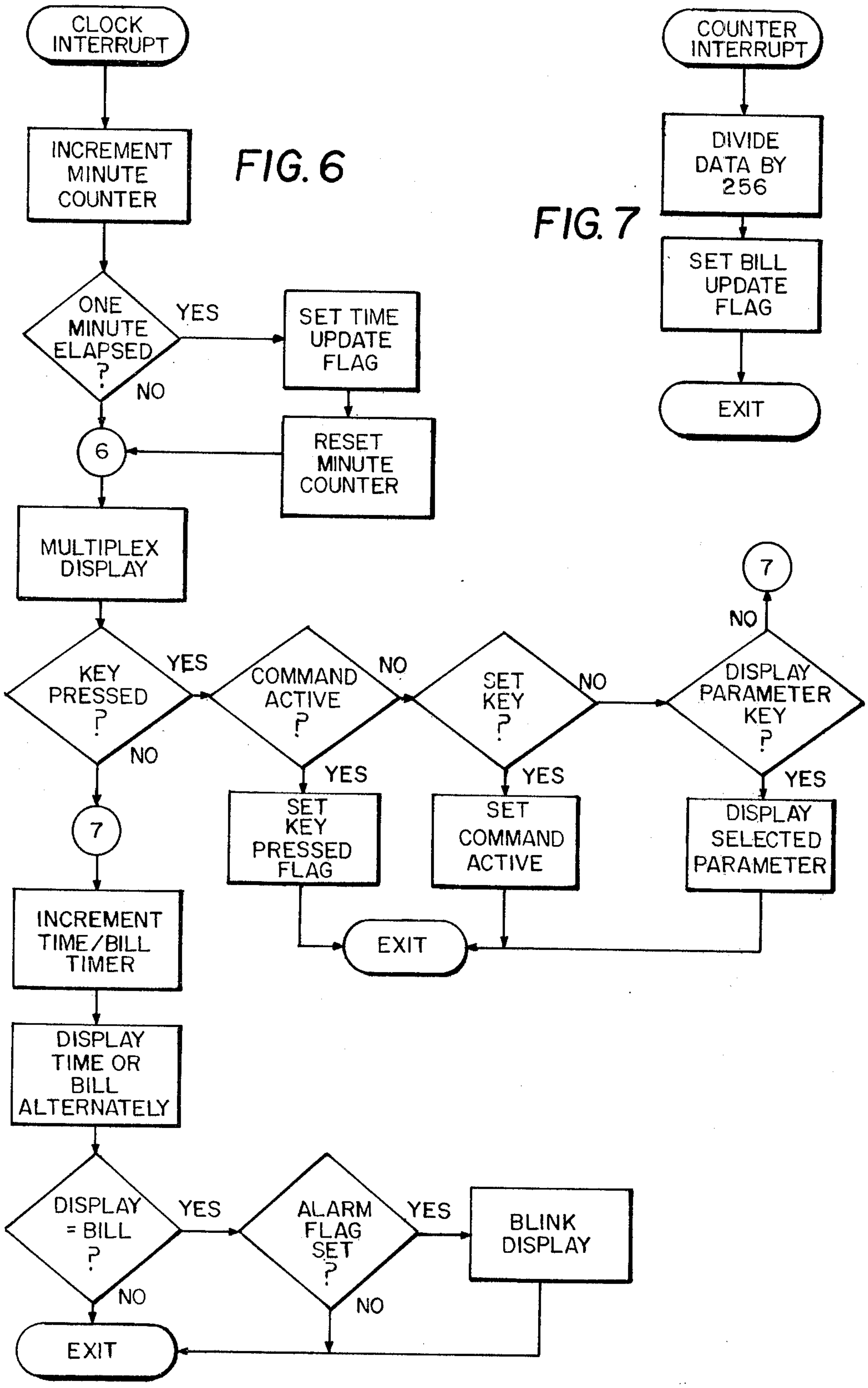

Referring now to FIGS. 5, 6 and 7, the flow charts therein describe the operation of the present system. In particular, the flow charts show the processes occurring in the microprocessor 50 to provide the desired outputs. It is understood that these operational steps could alternately be provided by hardwired circuitry with the same result as described hereinafter. The main process of the microprocessor unit is shown in FIG. 5. FIGS. 6 and 7 show interrupt processes which run simultaneous with the main program and which affect the main program by generating certain interrupt signals which change the flow of the main program, as will be described in greater detail hereinafter.

Referring to FIG. 5, the microprocessor parameters are first reset by reset signal I3 (FIG. 2) and the program is started. The parameters are initialized and the input/output ports are open. Preferably, the following parameters are manually keyed into the microprocessor memory: TIME, indicating the current time of day, DATE, indicating the current calendar day, YEAR, indicating the current year, RATE, indicating the current cost of energy, BILL DATE, that is the date on which a bill for energy usage is generated, DAYS, giving the number of days in the current month, and BUDGET, the maximum cost to be incurred for energy usage during the present billing period. A BILL parameter indicating current energy usage during the billing period begins at zero and accumulates as described hereinafter.

The next step is to perform a test to determine whether the TIME UPDATE flag is 0 or 1. If the flage is 0, the program moves on to the next set of sequences. If it is 1, the TIME parameter is incremented by one minute and is sampled to determine whether the day has ended. If not, the system moves on to the next set of sequences. If the end of the day has been reached, the DATE parameter is incremented by one day and the NEXT BILL parameter is computed. This computation is made by projecting the cost of energy usage over the remainder of the billing period (in this case one month) based on the current amount used for the current period of time elapsed. The equation used herein is as follows:

NEXT BILL=BILL×DAYS/DATE−BILL DATE

A comparison is then made between the NEXT BILL parameter and the BUDGET parameter. If NEXT BILL is greater than BUDGET the ALARM flag is set. A check is then made to determine whether the DATE parameter is equal to the BILL DATE parameter. If so, it is the end of the month and the BILL parameter is stored as the LAST BILL parameter and BILL is reset to 0. If it is the end of the month, the MONTH parameter is incremented by one. A test is also made to determine whether it is the end of the year and if so the YEAR parameter is incremented as well.

The next sequence involves updating the current BILL parameter. A test is made to determine whether the BILL UPDATE flag has been set. If so, this means that one watt-hour of electricity has been used and the cost of that watt-hour is computed and added to the BILL parameter. The next step is to determine whether a COMMAND INPUT flag has been set by keyboard activity. If not, the sequence returns to the start. If so, a test is made to determine whether the KEY PRESSED flag is set and if not, the sequence is returned to start. If the key has been pressed on the keyboard, the new command input is processed into the microprocessor system. The system than returns to start and proceeds again.

Referring to FIG. 6, the clock interrupt process is shown. Preferably, the clock signal is comprised of a 120 cycle signal which is continually fed into the microprocessor. Each time a clock pulse T2 (FIG. 2) is received a MINUTE counter is incremented and a test is made to determine whether one minute has elapsed. If so, the TIME UPDATE flag is set and the MINUTE counter is reset. As previously seen in FIG. 5, the TIME UPDATE flag initiates a change in the TIME parameter which also involves a BILL parameter update if the end of the day has been reached.

Looking back at FIG. 6, the display is multiplexed to alternately display both time and current bill automatically at five second intervals. The next step is to determine whether the keyboard key has been pressed. If so, and if the COMMAND flag is active, the KEY PRESSED flag is set and the process returns to start. If the set key on the keyboard has been depressed, then the COMMAND flag is activated and the process returns to start. Finally, if the display key has been depressed on the keyboard, the DISPLAY SELECTED flag is set and the process returns to start.

If a keyboard key has not been pressed, the system moves on to the automatic display multiplexing sequence. A TIME/BILL timer is incremented each five seconds to alternate a display of the TIME parameter and the BILL parameter. If the current display is the BILL parameter and the ALARM flag has been set, then the display will blink on and off rapidly to warn the user of over extended energy usage.

Looking now at FIG. 7, a brief bill update interrupt process is shown. This sequence consists entirely of a counting operation performed to reach one kilowatt hour of energy cost. In the present system, this is achieved each 256 DATA pulses received from the power sensing circuitry as shown in FIG. 2. At the end of the pulse count, the BILL UPDATE flag is set and the routine begins counting again. As can be seen from FIG. 5, if the BILL UPDATE flag is set, this means that one watt hour of electricity has been used and the bill is updated by computing that watt hour by the current rate divided by 1,000 and then by adding that amount to the current bill.

The only other interrupt routine of the present system is a manually generated interrupt when the keyboard is used. The keyboard interrupt signals are input along lines 72 and 76 which sets the KEY PRESSED flag.

Although a preferred embodiment of the present invention has been described in detail, it is understood that various changes, substitutions and alterations can be made therein without departing from the spirit and scope of the invention as defined by the appended claims.

What is claimed is:

1. Electrical circuitry for monitoring the amount of electrical energy consumed by a multiple phase system, comprising:

a plurality of pulse generators, each comprising means for sensing the current flowing along a separate input bus into the system and generating a DC signal having an amplitude representative of the magnitude of the input current;

summing means for combining each of said DC signals from each of said pulse generators, including means for generating pulsed digital signals having a frequency representative of the sum of the amplitudes of said combined DC signals;

microprocessor means in communication with said summing means for processing said pulsed digital signals including means for accumulating and counting the number of pulsed digital signals during a given period of time; and display means responsive to said counting means for displaying the pulse count during said period of time.

2. The circuitry of claim 1 wherein said sensing means comprises electromagnetic coil means for sensing the changes in the electromagnetic field about said input bus, means for generating an induced signal having an amplitude representative of the magnitude of current in said input bus, and rectifying means for converting said induced signal to said DC signal.

3. The circuitry of claim 2 wherein said rectifying means comprises a precision rectifier having compensating diodes for accurately detecting current flow in said input bus as low as 1.0 ampere.

4. The circuitry of claim 3 wherein said precision amplifier comprises an operational amplifier having first and second diodes connected between one of the inputs and the output of the operational amplifier.

5. The circuitry of claim 1 wherein said microprocessor further comprises comparator means for comparing the number of said pulses signals counted by the counting means to a predetermined number during said period of time; and output means for generating an output signal in response to said pulse number being equal to or greater than said predetermined number.

6. The circuitry of claim 5 wherein said microprocessor means further comprises alarm means connected to said output means to actuate an alarm device in response to said output signal.

7. The circuitry of claim 5 wherein said microprocessor means further comprises feedback control means connected to said output means for automatically modifying the amount of electrical power to said input bus in response to said output signal.

8. The circuitry of claim 5 wherein said microprocessor means further comprises reset means to return the pulse count of said counting means to zero after said predetermined period of time.

9. Electrical circuitry for monitoring the amount of electrical energy consumed by a multiple phase system, comprising:

a plurality of pulse generators, each comprising means for sensing the current flowing along a separate input bus into the system and generating a DC signal having an amplitude representative of the magnitude of the input current;

means for combining each of said DC signals for each of said pulse generators and outputting a combined DC signal representative of the magnitude of combined curent flow into the system;

pulse means responsive to said combined DC signal for generating pulsed digital signals having a frequency representative of the amplitude of said combined DC signal; and microprocessor means in communication with said pulse means for processing said pulsed digital signals including counting means for counting the number of said pulsed digital signals during a given period of time, comparator means for comparing the counted number of said pulsed digital signals counted by the counting means for generating an output signal in response to said counted pulse number being equal to or greater than said predetermined number.

10. Electrical circuitry for monitoring the amount of usage of a utility, comprising:

pulse means for generating a data digital pulse signal having a frequency representative of the rate of usage of said utility by said system;

clock means for generating a clock digital pulse signal representative of real time;

storage means for storing a first signal representative of a predetermined time period and a second signal representative of a predetermined amount of accumulated usage of said utility for said time period;

first counting means responsive to said data digital pulse signal for generating an accumulated signal representative of the current amount of accumulated utility usage;

second counting means responsive to said clock digital pulse signal for generating a time signal representative of the current expired time;

calculator means responsive to said first signal, said time signal and said accumulated signal for generating a projected signal representative of the projected amount of accumulated utility usage of said system for said predetermined time period; and comparator means responsive to said projected signal and said second signal for generating a control signal in response to said projected signal being greater than said second signal.

11. The circuitry of claim 10 wherein said pulse means comprises means for sensing the flow of said utility, means for generating a DC signal having an amplitude representative of said flow, and means for generating said data digital pulse signal in response to said DC signal.

12. The circuitry of claim 10 wherein said pulse means comprises a pulse initiating meter.

13. The circuitry of claim 10 wherein said storage means, first and second counting means, calculator means and comparator means comprise microprocessor means having a program storage unit, a data storage unit and an accumulator unit.

14. Electrical circuitry for monitoring the amount of cost for usage of a utility, comprising:

pulse means for generating a data digital pulse signal having a frequency representative of the rate of usage of said utility by said system;

clock means for generating a clock digital pulse signal representative of real time;

storage means for storing a first signal representative of a predetermined time period and a second signal representative of a predetermined amount of accumulated cost of said utility for said time period;

first counting means responsive to said data digital pulse signal for generating an accumulated signal representative of the current accumulated utility usage;

second counting means responsive to said clock digital pulse signal for generating a time signal representative of the current expired time;

calculator means responsive to said first signal, said time signal and said accumulated signal for generating a projected signal representative of the projected amount of accumulated utility cost of said system for said predetermined time period; and comparator means responsive to said projected signal and said second signal for generating a control signal in response to said projected signal being greater than said second signal.

15. The circuitry of claim 14 and further comprising display means for displaying said accumulated signal in numerical form to indicate said current cost.

16. The circuitry of claim 15 wherein said display means alternately displays the time signal and the accumulated signal in numerical form.

17. The circuitry of claim 15 wherein said display means optionally displays said projected signal in numerical form to indicate projected cost.

18. The circuitry of claim 14 and further comprising second storage means for storing a signal representative of accumulated utility usage for a previous said time period.

19. Electrical circuitry for monitoring the amount of usage of a utility comprising:

means for generating a first pulse train representative of the rate of utility usage;

means for generating a second pulse train representative of the real time rate;

microprocessor means, including means for storing a first signal representative of a predetermined time period and a second signal representative of a predetermined amount of utility usage, means for counting the first and second pulse trains, means for calculating the projected utility usage for said predetermined time period and means for generating a control signal in response to said projected utility usage exceeding said predetermined amount of utility usage; and keyboard means for inputting said first and second signals.

20. The circuitry of claim 19 and further comprising control means responsive to said control signal for modifying the amount of usage of said utility.

21. The circuitry of claim 19 and further comprising alarm means for generating an alerting signal to the user in response to said control signal.

22. The circuitry of claim 19 and further comprising display means for numerically displaying the accumulated utility usage of said system.

23. The circuitry of claim 19 wherein said calculating means comprises means for determining the cost of said projected utility usage.

24. Electrical circuitry for monitoring the amount of electrical energy consumed by an electrical system, comprising:

means for sensing the flow of electrical power in the input of said system and generating digital pulses having a frequency representative of the amplitude of said power flow;

first means for counting said digital pulses and for generating a sum signal representative of the cumulative amount of energy used over a predetermined time period;

clock means for generating real time clock signal pulses;

second means for counting said clock signal pulses and for generating day signals and time signals representative of the calendar day and the time of day;

storage means for storing a signal representative of the billing period and a signal representative of the maximum desired energy usage during said billing period;

calculator means in communication with said storage means and said first and second counting means for generating signals representative of the present rate of the energy usage and the projected amount of energy usage for said billing period;

comparator means for comparing the signal representative of the projected amount of energy usage for said billing period to the signal representative of said maximum desired energy usage; and means for generating an alarm signal in response to said signal representative of the projected amount of energy usage being greater than said signal representative of said maximum desired energy usage.

25. Electrical circuitry for monitoring the cost of electrical energy consumed by an electrical system, comprising:

means for sensing the flow of electrical power in the input of said system and generating digital pulses having a frequency representative of the amplitude of said power flow;

first means for counting said digital pulses and for generating a sum signal representative of the cumulative cost of energy used over a predetermined time period;

clock means for generating real time clock signal pulses;

second means for counting said clock signal pulses and for generating day signals and time signals representative of the calendar day and the time of day;

storage means for storing a signal representative of the billing period and a signal representative of the maximum desired energy cost during said billing period;

calculator means in communication with said storage means and said first and second counting means for generating signals representative of the present rate of the energy cost and the projected amount of energy cost for said billing period;

comparator means for comparing the signal representative of the projected amount of energy cost for said billing period to the signal representative of said maximum desired energy cost; and means for generating an alarm signal in response to said signal representative of the projected amount of energy cost being greater than said signal representative of said maximum desired energy cost.

26. Electrical circuitry for monitoring the amount of usage of a utility on a utility line, said line having a pulse generator for providing a data digital pulse signal with a frequency representative of the rate of usage of said utility by said system, comprising:

clock means for generating a clock digital pulse signal representative of real time;

first counting means responsive to said data digital pulse signal for generating a usage signal representative of the current amount of accumulated utility usage;

second counting means responsive to said clock digital pulse signal for generating a time signal representative of the current expired time;

storage means for storing a time period signal representative of a predetermined time period, and for storing said usage signal and said time signal;

calculator means responsive to said time period signal, said time signal and said usage signal for generating a projected signal representative of the projected amount of accumulated utility usage of said system for said predetermined time period; and display means in communication with said calculator means for displaying said projected signal.

27. The circuitry of claim 26 wherein said storage means, first and second counting means and calculator means comprise a microprocessor having a program storage unit, a data storage unit and an accumulator unit.

28. Electrical circuitry for monitoring the cost of usage of a utility on a utility line, said line having a pulse generator for providing a data digital pulse signal with a frequency representative of the rate of usage of said utility by said system, comprising:

clock means for generating a clock digital pulse signal representative of real time;

first counting means responsive to said data digital pulse signal for generating a cost representative of the current cost of accumulating utility usage;

second counting means responsive to said clock digital pulse signal for generating a time signal representative of the current expired time;

storage means for storing a time period signal representative of a predetermined time period, and for storing said cost signal and said time signal;

calculator means responsive to said time period signal, said time signal and said cost signal for generating a projected signal representative of the projected amount of accumulated utility cost of said system for said predetermined time period; and display means in communication with said calculator means for displaying said projected signal.

29. The circuitry of claim 28 wherein said storage means, first and second counting means and calculator means comprise a microprocessor having a program storage unit and data storage unit and an accumulator unit.

30. Electrical circuitry for monitoring the amount of usage of a utility comprising:

first generating means for generating a first pulse train representative of the rate of utility usage;

second generating means for generating a second pulse train representative of the real time rate;

storage means for storing a first signal representative of a predetermined time period;

counting means responsive to the first and second pulse trains for counting the first and second pulse trains;

calculating means responsive to the storage means and the counting means for generating a projection signal representative of the projected utility usage for said predetermined time period; and means for displaying said projection signal to indicate the projected amount of utility usage during said predetermined time period.

31. Electrical circuitry for monitoring the amount of electrical energy consumed by a multiple phase system, comprising:

a plurality of pulse generators, each comprising means for sensing the current flowing along a separate input bus into the system and generating a DC signal having an amplitude representative of the magnitude of the input current;

means for combining each of said DC signals from each of said pulse generators and for generating pulsed digital signals having a frequency representative of the sum of the amplitude of said combined DC signals;

microprocessor means in communication with said summing means for processing said pulsed digital signals including means for accumulating and counting the number of pulsed digital signals during a given period of time;

said microprocessor further comprising comparator means for comparing the number of said pulse signals counted by the counting means to a predetermined number during said period of time, output means for generating an output signal in response to said pulse number being equal to or greater than said predetermined number, and feedback control means connected to said output means for automatically modifying the amount of electrical power to said input bus in response to said output signal; and display means responsive to said counting means for displaying the pulse count during said period of time.

32. Electrical circuitry for monitoring the amount of usage of a utility comprising:

means for generating a first pulse train representative of the rate of utility usage;

means for generating a second pulse train representative of the real time rate;

microprocessor means, including means for storing a first signal representative of a predetermined time period and a second signal representative of a predetermined amount of utility usage, means for counting the first and second pulse trains, means for calculating the projected utility usage for said predetermined time period and means for generating a control signal in response to said projected utility usage exceeding said predetermined amount of utility usage;

keyboard means for inputting said first and second signals; and control means responsive to said control signal for modifying the amount of usage of said utility.

* * * * *